US011569371B2

(12) United States Patent
Deviny et al.

(10) Patent No.: US 11,569,371 B2
(45) Date of Patent: Jan. 31, 2023

(54) SEMICONDUCTOR DEVICE

(71) Applicants: Dynex Semiconductor Limited, Lincolnshire (GB); Zhuzhou CRRC Times Electric Co. Ltd., Hunan (CN)

(72) Inventors: Ian Deviny, Lincolnshire (GB); Luther-King Ngwendson, Lincolnshire (GB); John Hutchings, Lincolnshire (GB)

(73) Assignees: DYNEX SEMICONDUCTOR LIMITED, Lincoln (GB); ZHUZHOU CRRC TIMES ELECTRIC CO. LTD., Hunan (CN)

( * ) Notice: Subject to any disclaimer, the term of this patent is extended or adjusted under 35 U.S.C. 154(b) by 0 days.

(21) Appl. No.: 16/615,900

(22) PCT Filed: May 25, 2017

(86) PCT No.: PCT/GB2017/051492
§ 371 (c)(1),
(2) Date: Nov. 22, 2019

(87) PCT Pub. No.: WO2018/215727
PCT Pub. Date: Nov. 29, 2018

(65) Prior Publication Data
US 2020/0127128 A1    Apr. 23, 2020

(51) Int. Cl.
*H01L 29/739* (2006.01)
*H01L 29/06* (2006.01)
(Continued)

(52) U.S. Cl.
CPC .... *H01L 29/7397* (2013.01); *H01L 21/76205* (2013.01); *H01L 29/0696* (2013.01);
(Continued)

(58) Field of Classification Search
CPC ............ H01L 29/7397; H01L 29/0696; H01L 29/0804–0834; H01L 29/1004;
(Continued)

(56) References Cited

U.S. PATENT DOCUMENTS 6,111,278 A * 8/2000 Kim .................... H01L 29/0692
257/E29.198
6,747,295 B2 * 6/2004 Inoue ................ H01L 29/66348
257/133
(Continued)

FOREIGN PATENT DOCUMENTS

DE    102015105335 A1    10/2015
EP         1760790 A1     3/2007
WO      2006008888 A1     1/2006

OTHER PUBLICATIONS

International Search Report and Written Opinion dated Nov. 14, 2017 for corresponding International Patent Application No. PCT/GB2017/051492.

*Primary Examiner* — Natalia A Gondarenko
(74) *Attorney, Agent, or Firm* — Tarolli, Sundheim, Covell & Tummino LLP

(57) ABSTRACT

We disclose herein a gate controlled bipolar semiconductor device comprising: a collector region of a first conductivity type; a drift region of a second conductivity type located over the collector region; a body region of a first conductivity type located over the drift region; a plurality of first contact regions of a second conductivity type located above the body region and having a higher doping concentration than the body region; a second contact region of a first conductivity type located laterally adjacent to the plurality of first contact regions, the second contact region having a higher doping concentration than the body region; at least two active trenches each extending from a surface into the drift region; an emitter trench extending from the surface (Continued)

into the drift region; wherein each first contact region adjoins an active trench so that, in use, a channel is formed along said each active trench and within the body region; wherein the second contact region adjoins the emitter trench; and wherein the emitter trench is located between two active trenches.

19 Claims, 12 Drawing Sheets

(51) Int. Cl.
- *H01L 29/08* (2006.01)
- *H01L 29/10* (2006.01)
- *H01L 29/66* (2006.01)
- *H01L 21/762* (2006.01)

(52) U.S. Cl.
CPC ...... *H01L 29/0804* (2013.01); *H01L 29/1095* (2013.01); *H01L 29/66325* (2013.01); *H01L 29/66348* (2013.01); *H01L 29/7394* (2013.01)

(58) Field of Classification Search
CPC ........... H01L 29/1095; H01L 29/66318; H01L 29/66325; H01L 29/66265; H01L 29/66234–66348; H01L 29/6348; H01L 29/7394; H01L 29/73–7378; H01L 29/739–7398; H01L 29/0623; H01L 29/407; H01L 29/41708; H01L 29/41716; H01L 29/42304; H01L 29/42356; H01L 29/4236; H01L 29/42376; H01L 29/4238; H01L 29/42368; H01L 2924/1305–13056; H01L 29/66295–66303; H01L 21/74–746; H01L 21/76205; H01L 21/76847; H01L 21/76877; H01L 21/8222; H01L 21/82285; H01L 21/8249

USPC ... 257/139, 330, 331, 586, 583, 510, 29.201

See application file for complete search history.

(56) References Cited

U.S. PATENT DOCUMENTS

| | | | |
|---|---|---|---|
| 8,129,818 B2* | 3/2012 | Tooi | H01L 29/1095 257/586 |
| 9,601,592 B2* | 3/2017 | Senoo | H01L 29/36 |
| 2008/0121930 A1* | 5/2008 | Adam | H01L 29/0821 257/190 |
| 2009/0206924 A1 | 8/2009 | Zeng | |
| 2012/0146091 A1* | 6/2012 | Tanabe | H01L 29/1095 257/139 |
| 2015/0021656 A1 | 1/2015 | Kitagawa | |
| 2017/0018636 A1 | 1/2017 | Naito | |
| 2019/0067463 A1* | 2/2019 | Abe | H01L 29/407 |

* cited by examiner

SEMICONDUCTOR DEVICE

RELATED APPLICATIONS

The present application is a U.S. National Stage application under 35 USC 371 of PCT Application Serial No. PCT/GB2017/051492, filed on 25 May 2017; the entirety of which is incorporated herein by reference.

FIELD OF INVENTION

The present invention relates to a semiconductor device with a recessed emitter trench, particularly but not exclusively, to an insulated gate bipolar transistor in which the recessed emitter trench and a p+ contact region have at least a segmented three-dimensional geometry.

BACKGROUND TO THE INVENTION

Power semiconductor devices are often used as switches as they operate in both on and off states. In the on-state a device can conduct high currents, and conduction losses are desired to be reduced. In the off-state a device can withstand the system maximum voltage with little or no current passing.

Insulated gate bipolar transistors (IGBTs) have the combined advantage of metal-oxide semiconductor (MOS) gate drive with the high current densities found in bipolar transistors. Bipolar transistors make use of conduction by majority and minority carriers. This means that bipolar transistors have a high density of charge carriers. This high level of charge reduces on-state conduction losses ($V_{CE(ON)}$) however increases switching losses ($E_{OFF}$) and switching time.

Within IGBTs it is advantageous to increase the concentration of the carrier storage layer (CS layer) to improve the $V_{CE(ON)}$-$E_{OFF}$ trade-off relationship. However this degrades breakdown voltage ($V_{BR}$). Reducing the trench-to-trench spacing is one way of improving the $V_{CE(ON)}$-$E_{OFF}$ trade-off relationship without sacrificing $V_{BR}^2$. The close proximity of the trenches results in a more uniform electrical potential distribution between the trenches and eliminates the electric field crowding at the bottom of the trenches.

In IGBTs, where trench-to-trench separation is miniaturised and current density is high, the reverse bias safe operating area (RBSOA) and short circuit safe operating area (SCSOA) performance can be compromised. Previously this has been controlled by either changing the length of the n+ emitter or changing the resistance or doping concentration under the junction between the n+ emitter region and the p-well region. However, trench-to-trench spacing can limit how much the doping of the n-well can be enhanced without $V_{BR}$ degradation.

SUMMARY OF THE INVENTION

The present invention has a grounded recessed emitter trench to improve current handling capability and improve the safe operating areas (SOAs) in a power device such as an IGBT. The trench is maintained at a grounded potential, forcing the hole-current to flow vertically along the emitter trench side-walls. The hole current avoids the electron current within the p-well (or p-body) and avoids the region under the n+ emitter/p-well junction. This reduces the hole current flowing laterally through the p-well and suppresses latch-up in the device. The main purpose of the emitter trench is to tailor the hole flow path so it is desirable to make it smaller and shallower than the active gate trench to improve active cell density.

The use of a fully recessed emitter trench means it is possible to have trench-to-trench separation less than or equal to about 0.5 μm without photolithographic limitations. The emitter trench and the p+ emitter region are at least partially segmented (or varied) in the third dimension whereas conventional devices vary only in two dimensions. This allows the trench-to-trench separation to be miniaturised further in the first dimension. In the present invention, the p+ emitter regions extend within the emitter trench so that both the p+ emitter regions and emitter trench are at least partially segmented. It is advantageous that the active gate trenches surround the fully recessed emitter trench which means that it is protected from high electric fields hence can have a smaller width and shallower depth without degrading the breakdown voltage. In other words, the active gate trenches shield the emitter trench from high electric fields so that emitter trench width can be smaller (or have some sort of modulation) and its depth made shallower than active gate trench without any degradation in breakdown voltage. This is advantageous when high degree of miniaturisation of the active cell dimension is desired.

According to one aspect of the present invention, there is a gate controlled bipolar semiconductor device comprising:
   a collector region of a first conductivity type;
   a drift region of a second conductivity type located over the collector region;
   a body region of a first conductivity type located over the drift region;
   a plurality of first contact regions of a second conductivity type located above the body region and having a higher doping concentration than the body region;
   a second contact region of a first conductivity type located laterally adjacent to the plurality of first contact regions, the second contact region having a higher doping concentration than the body region;
   at least two active trenches each extending from a surface into the drift region;
   an emitter trench extending from the surface into the drift region;
   wherein each first contact region adjoins an active trench so that, in use, a channel is formed along said each active trench and within the body region;
   wherein the second contact region adjoins the emitter trench; and
   wherein the emitter trench is located between two active trenches.

Advantageously, the emitter trench between two active trenches is shielded from high electric fields. As a result, the emitter trench may have smaller width and shallower depth than the active gate width without degrading breakdown voltage. In addition, it can be fully recessed to improve surface planarity and reliability.

It will be appreciated that the emitter trench can be fully recessed in some embodiments. This generally results in a smaller width and a shallower depth for the emitter trench compared to the active trenches.

In general, this invention helps to enable gate controlled bipolar transistors to achieve very low conduction loss (Vceon), enhanced Vceon/Eoff trade-offs and enhanced RBSOA and SCSOA parameters.

The second contact region may be located between two laterally spaced first contact regions. The gate controlled bipolar semiconductor device may be configured such that the emitter trench is biased at a ground potential.

The active trench and the emitter trench may be laterally spaced in a first dimension (or a horizontal direction or X-direction), where the current may flow in the device in a second dimension (or a vertical direction or Y-direction) substantially transverse to the first dimension, and where the active trench and emitter trench may extend in a third dimension (or Z-direction) of the device. The third dimension extends in a different direction compared with the first and second dimensions.

The second contact region may be formed in the third dimension of the device. The second contact region may be formed at least partially within the emitter trench in the third dimension of the device. The width of the second contact region may be less than or equal to a width of the emitter trench. This reduces the hole collection area, which improves 'hole pile up' effect. This may enhance the conductivity modulation in the emitter region, reducing on-state conduction loss.

The second contact region may extend into the emitter trench in the third dimension of the device. The second contact region may not extend into the body region between the active trench and the emitter trench. This allows the trench-to-trench dimension to be reduced as photolithographic limitations are removed. The second contact (p+) dimension is generally fixed by the emitter trench design which means freedom of miniaturising as much as possible. Freedom to miniaturise hole collection area in the on-state which enhances carrier density in the emitter region and reduces conduction loss (Vceon). As discussed above, during on-state and turn-off, hole current flowing to the emitter contact is separated from the electron current which significantly enhances the IGBT Safe Operating Area (RBSOA and SCSOA). The grounded emitter trench potential causes the holes in deep saturation and turn-off to flow vertically along the emitter trench side-walls and collected at the emitter metal without having to flow under the n+ emitter. Hole current flowing under the n+ emitter causes latch up in IGBTs and limits Safe Operating Area.

The emitter trench may comprise a plurality of segments in the third dimension, where the segments may be shaped such that at least a space is formed between two segments.

The second contact region may comprise a plurality of portions in the third dimension, each portion being located within the space formed between two segments of the emitter trench.

The segments of the emitter trench may be continuous segments having a substantially 'S' shape, where the portions of the second contact region each have a smaller width compared to the segments of the emitter trench. In another embodiment of the invention, the segments of the emitter trench may be discontinuous segments, and the portions of the second contact region each may have a substantially equal width compared to the segments of the emitter trench. Given that the second contact region (or emitter p+) is formed only in the third dimension (z-direction), the trench to trench dimension in x-direction can be significantly miniaturised because photolithographic limitations are removed.

In a further embodiment of the invention the segments of the emitter trench may have a cross shape having a variable width along the third dimension. Two portions of the second contact region may be laterally spaced and a segment of the emitter trench may be formed between the two portions of the second contact region, where the segment between two portions may have a predetermined width. The connection between the trench segments having a predetermined width ($W_{et2}$) further reduces the second (p+) contact area. In the on-state, reduced p+ contact area reduces hole collection area to improve 'hole pile up' effect, which enhances the conductivity modulation in the emitter region. Advantageously this results in a reduced on-state conduction loss (Vceon).

The first contact region may be a continuous region in the third dimension.

The first contact region may comprise segments spaced from one another in the third dimension. This allows reduction or tailoring of the electron current. The saturation current density and short circuit capability are directly related to the electron current.

The device may further comprise a region adjacent to the emitter trench, where the region comprises a first recessed portion which may extend from the surface of the device to the emitter trench.

In a further embodiment, the device may further comprise a second recessed portion which may extend from the first recessed portion into the emitter trench. When the emitter trench dimension becomes too small (e.g. less than 0.5 μm) it may be beneficial to have a first recessed portion larger than the emitter trench width. This improves hole collection area which can lower turn off energy loss.

The device may further comprise a silicide layer along the edges of the first and second recessed portions. The silicide layer can be titanium silicide (TiSix). TiSix is used to electrically short the first contact (n+) and the second contact (p+) regions in the emitter regions because metal contact is only over the second contact (p+) regions.

The active trenches and the emitter trench may have the same width in the first dimension. Alternatively, the active trenches and the emitter trench may have different widths in the first dimension. The active trenches and the emitter trench can have a symmetrical shape or an asymmetrical shape. The depth of the active trenches can be more or less than the depth of the emitter trench. However, the depth of the active trenches and emitter trench can be substantially the same.

The device may further comprise implants of a first conductivity type on the bottom of one or more of the active and emitter trenches. These can relieve the electric field stress due to geometrical effects under the trenches. The high electric field stress can cause premature device breakdown, so the presence of the implants are advantageous.

The device may further comprise an oxide layer at a bottom side wall which may be thicker than an oxide layer at vertical sidewalls of one of more of the active and emitter trenches. The thick oxide improves immunity to high electric field stress and harnesses the device breakdown voltage. The high electric field stress can cause premature device breakdown, so the presence of the thick oxide is advantageous. Oxide breakdown electric field increases with oxide thickness.

One or more of the active and emitter trenches may comprise split embedded electrodes. By applying a potential differential to the split gate electrodes, electron injection can be enhanced in the on-state. Enhanced electron injection will improve conductivity modulation in the emitter region and reduce conduction loss.

The device may further comprise a charge storage layer of a second conductivity type between the drift region and body region. The charge storage layer enhances the plasma density in the top cell of bipolar devices such as IGBTs by increasing the barrier height for holes flowing to the emitter.

The device may be an insulated gate bipolar transistor (IGBT).

In another embodiment of the invention the collector may comprise a plurality of first segments of a first conductivity type and a plurality of second segments of a second conductivity type, where the first and second segments may be laterally adjacent to one another.

The device may be a reverse conducting insulated gate bipolar transistor (RC-IGBT). RC-IGBTs can benefit from this invention because the emitter contact area can be much less than conventional IGBT. Also, reduced trench to trench spacing can relax optimisation requirements between regions of a first and second conductivity type in the collector region.

In a further embodiment of the invention the device may further comprise:
 a floating semiconductor body of a second conductivity type underneath the body region;
 a base region of a first conductivity type underneath the floating semiconductor body;
 wherein the base region is connected to the body region in the third dimension; and
 wherein the base region is biased at a ground potential through the second contact region.

The device may be an emitter switched thyristor (EST). ESTs provide lower on-state voltage or conduction loss than IGBTs because of the thyristor mode of operation in the on-state, compared to PNP transistor action, in IGBTs. This enables Emitter Switched Thyristors to benefit from reduced $V_{CE(ON)}$ and enhanced $V_{CE(ON)}$-$E_{OFF}$ trade-offs.

According to a further aspect of the present invention, there is provided a method for manufacturing a gate controlled bipolar semiconductor device, the method comprising:
 forming a collector region of a first conductivity type;
 forming a drift region of a second conductivity type located over the collector region;
 forming a body region of a first conductivity type located over the drift region;
 forming a plurality of first contact regions of a second conductivity type located above the body region and having a higher doping concentration than the body region;
 forming a second contact region of a first conductivity type located laterally adjacent to the plurality of first contact regions, the second contact region having a higher doping concentration than the body region;
 forming at least two active trenches each extending from a surface into the drift region;
 forming an emitter trench extending from the surface into the drift region;
 wherein each first contact region adjoins an active trench so that a channel is formed along said each active trench and within the body region;
 wherein the second contact region adjoins the emitter trench; and
 wherein the emitter trench is located between two active trenches.

BRIEF DESCRIPTION OF THE DRAWINGS

The present disclosure will be understood more fully from the detailed description that follows and from the accompanying drawings, which however, should not be taken to limit the invention to the specific embodiments shown, but are for explanation and understanding only.

DETAILED DESCRIPTION OF EMBODIMENTS

Figure 1:
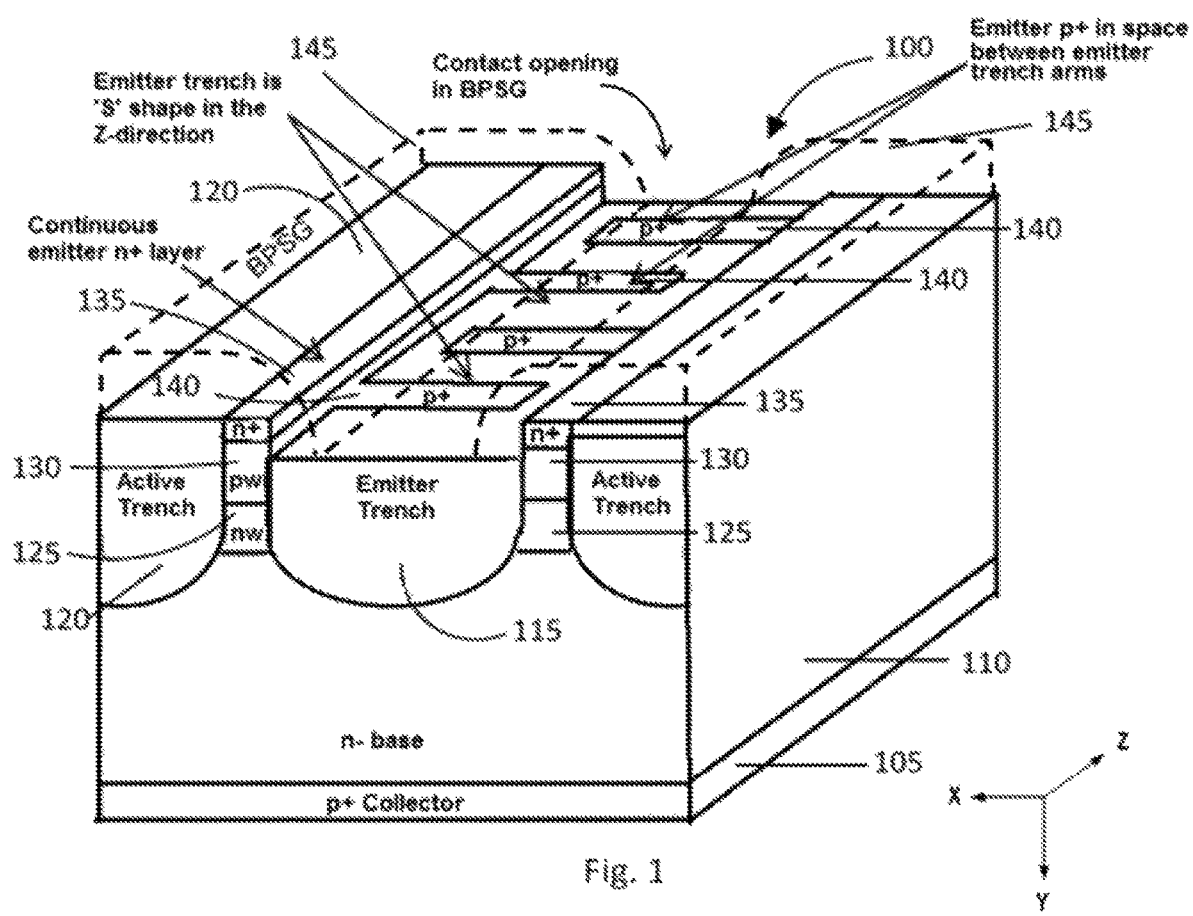
FIG. 1 illustrates a schematic three-dimensional (3D) view of a recessed emitter trench semiconductor device without a silicide layer according to one embodiment.

FIG. 1 is a schematic three-dimensional (3D) view of a recessed emitter trench semiconductor device 100 in the form of an insulated gate bipolar transistor (IGBT), according to one embodiment. The device 100 is presented in three dimensions: a first dimension (x-direction), a second dimension (y-direction) and a third dimension (z-direction).

In this embodiment, the device 100 comprises an n-type voltage sustaining region or n-base (or a drift region) 110 on top of over a collector p+ layer (substrate) 105. The collector p+ layer 105 is a p-type diffusion on the backside that supplies holes in the on-state for bipolar conduction. The device 100 includes an active trench (or first trench) 120 extending down in the y-direction into the n-base 110 from the surface of an n+ contact region (or first contact region) 135. The active trench 120 acts as a trench gate along which a MOS channel is formed in an on-state by application of a positive voltage. Within the n-base 110 and adjacent the active trench 120, there is provided a p-well or p-body (or a body region) 130. Within the p-base or p-body 130, the n+ contact region 135 of the emitter is formed.

In the embodiment of FIG. 1, an emitter trench 115 is formed which is laterally spaced from the active trench 120. In this embodiment, the emitter trench 115 is formed between two active trenches 120, extending down in the y-direction, recessed in the y-direction below a junction between the n+ contact region 135 of the emitter and the A-base (p-well region) 130. Each trench 115, 120 includes vertical sidewalls and a bottom surface between the vertical sidewalls. The active and emitter trenches 115, 120 can be doped polysilicon trenches with oxide on the side walls. The active trench 120 can also be a dielectric filled trench with a gate metal electrode within the trench. The emitter trench 115 can also be a dielectric filled trench with or without a metal electrode within.

In the embodiment of FIG. 1, underneath the p-base (p-well layer) 130, and in contact with both the p-base 130 and the n-base layer 110, there is an n-well layer 125. This n-well layer 125 acts as a charge storage (CS) layer. The emitter trench 115 is connected to the emitter metal (not shown). The emitter trench 115 is grounded in all modes of operation. The emitter and active gate trenches may have similar widths. The emitter trench 115 has a substantially 's' shape or zigzagged shape along the z-direction when viewed in the x-z plane. The emitter trench 115 is at least partially segmented so that in the z-dimension (or the third dimension), some portions of the emitter trench 115 is empty or not filled by trench materials. In other words, the emitter trench 115 has continuous zigzagged segments in the z-dimension so that there are empty spaces between two spaced continuous segments. In these empty spaces, an emitter p+ contact layer (or the second contact region) 140 is formed above the p-base (p-well layer) 130 between spaced segments of the emitter trench 115 in the z-direction. The width of the p+ emitter 140 in the z-direction is defined (constrained) by the width of the gaps between the emitter trench segments 115. The p+ contact layer 140 extends within the width of the emitter trench 115 in the x-dimension. The p+ contact layer 140 does not extend outside the vertical sidewalls of the emitter trench 115.

A layer of borophosphosilicate glass (BPSG) 145 is formed on top of the gate trenches 120, emitter trench 115, n+ contact layer 135, and p+ contacts 140. The BPSG 145 is etched to reveal a contact opening.

During operation the recessed emitter trench 115 allows miniaturised trench-to-trench spacing to be achieved without photolithographic limitations. This allows the doping level in the n-well layer (CS) 125 to be increased without voltage breakdown degradation. As the emitter p+ 140 dimension is fixed by the emitter trench variation 115 in the third dimension, the emitter p+ contact 140 can be miniaturised as much as possible and is not limited by photolithography. As the hole collection area 140 is miniaturised in the on-state, carrier density in the emitter region 140 is enhanced and $V_{CE(ON)}$ reduced. In the on-state and during turn-off the close proximity of the trenches causes a uniform electric field to be formed between the trenches. Given that the emitter trench 115 is grounded, holes are forced to flow vertically along the side-walls of the emitter trench 115 to be collected at the p+ emitter contacts 140. Holes do not have to flow under the n+ emitter 135 and so latch-up is reduced. A top metal can be used which can be Aluminium, Tungsten plug or similar.

Figure 2:
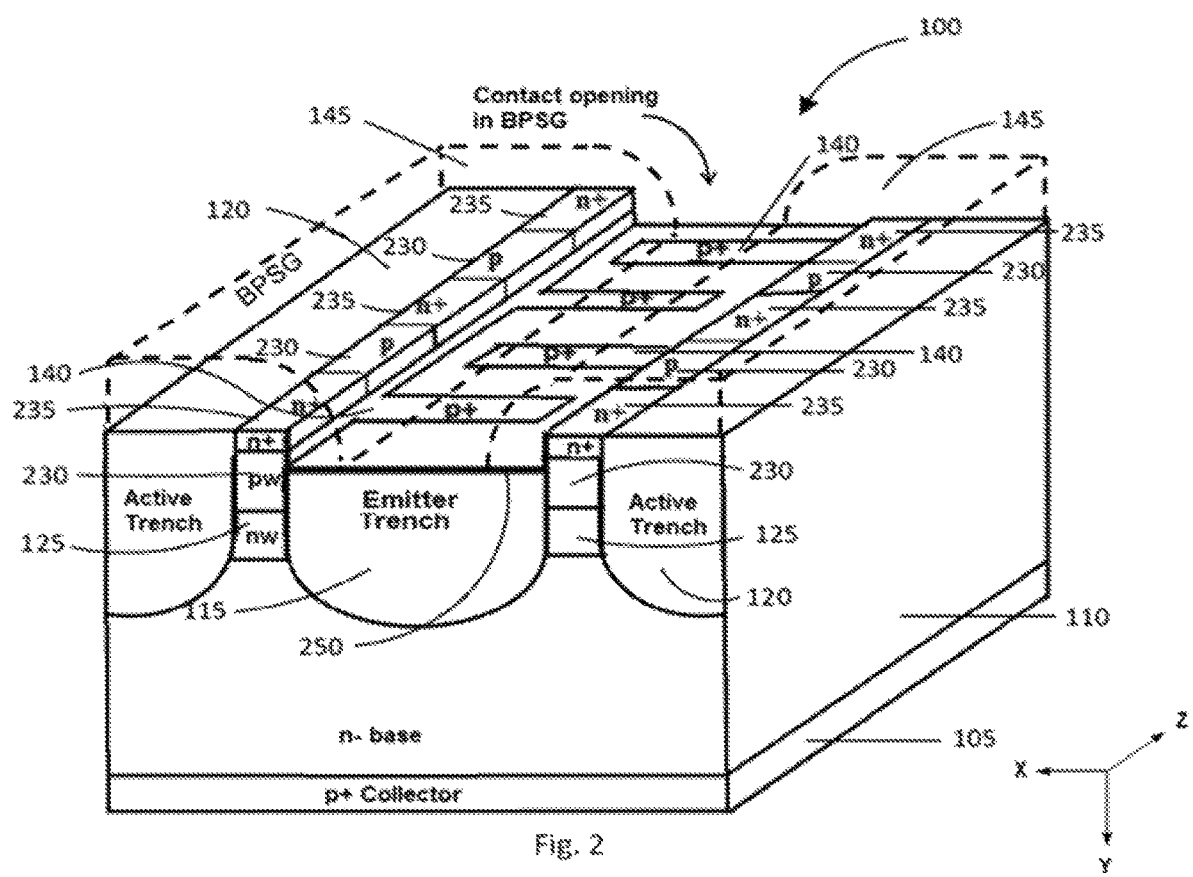
FIG. 2 illustrates a 3D view of an alternative semiconductor device with a segmented n+ emitter according to one embodiment.

FIG. 2 shows a three-dimensional view of an IGBT according to a further embodiment of the invention. Many features of this embodiment are the same as those shown in FIG. 1 and therefore carry the same reference numerals. However, the n+ contact layer (or the first contact layer) 235 is segmented in the z-direction. In other words, the n+ contact layer 235 is not a continuous layer. There are n+ contact layer segments or portions 235 each spaced in the z-dimension (or the third dimension). The p-body layer 230 is formed to extend up in the y-direction into the spaces between n+ contact segments 235. The segmentation of the n+ emitter 235 allows the MOS electron current to be reduced or tailored. In trench gate IGBTs, the saturation current density and short circuit capability are directed related to the MOS electron current. A silicide layer 250 is formed along the edges of the recessed portion (or indent edges) of the device. The silicide layer 250 short circuits the n+ contact region 235 to the p+ contact region 140 because the metal contact is only over the p+ contact region 140. The silicide layer 250 may be formed of Titanium Silicide (TiSix), however plasma enhanced chemical vapour deposition (PECVD) Tungsten may also be used.

Figure 3:
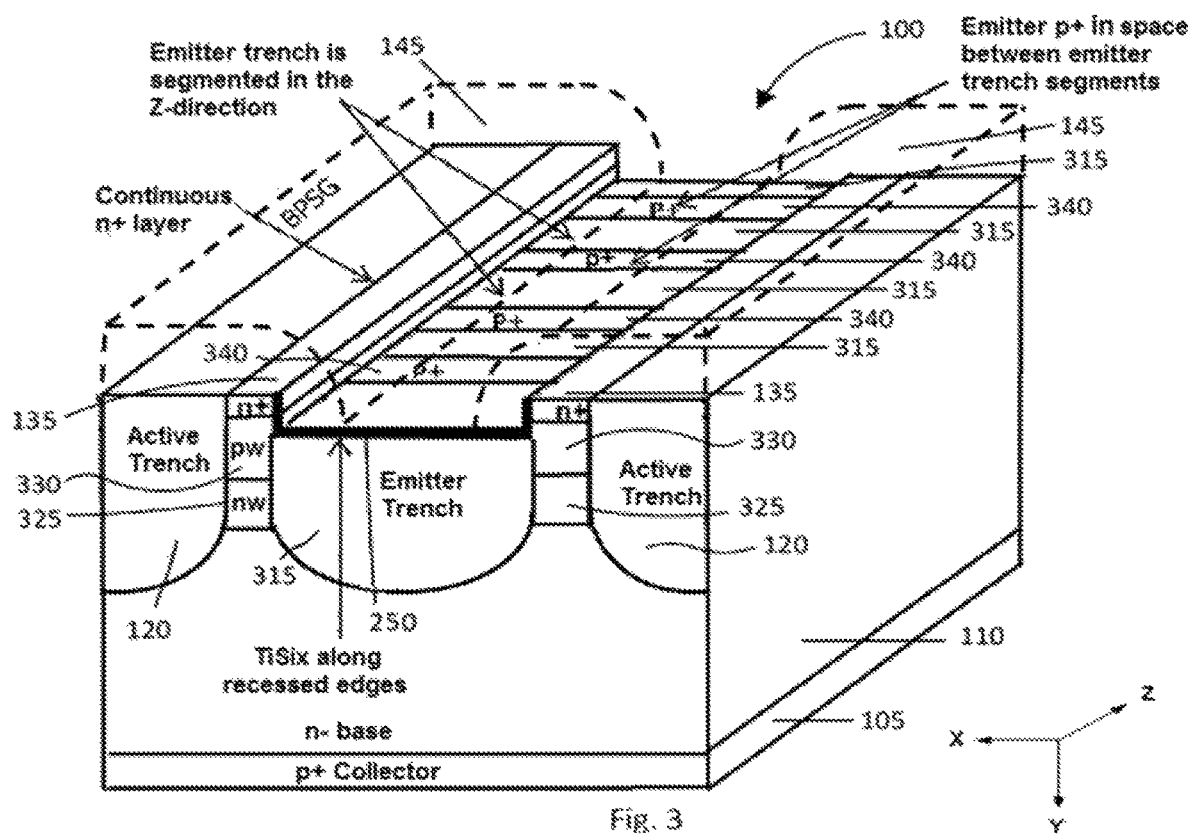
FIG. 3 illustrates a 3D view of an alternative semiconductor device with the emitter trench fully segmented in the third (z) direction according to one embodiment.

FIG. 3 shows a three-dimensional view of an IGBT according to a further embodiment of the invention. Many of the features of this embodiment are the same as those shown in FIG. 1 and therefore carry the same reference numerals. In this embodiment the emitter trench comprises discontinuous segments 315 in the z-direction. The p+ contact regions (or the second contact region) 340 are formed between the emitter trench segments 315. The emitter trench segments 315 are connected by the TiSix layer 250. In this embodiment the n-well layer 325 is above the p-well layer 330.

Figure 4:
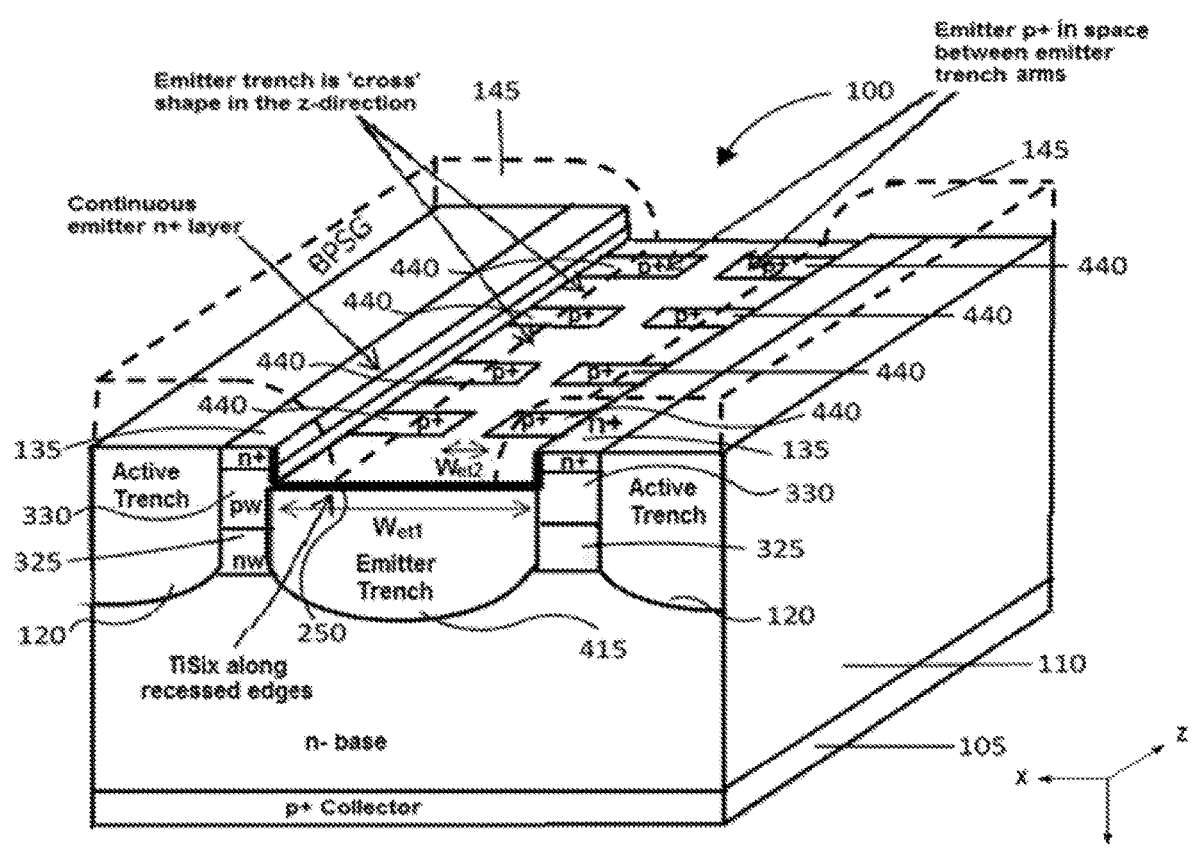
FIG. 4 illustrates a 3D view of an alternative semiconductor device with the emitter trench having width variation in the third-dimension according to one embodiment.

FIG. 4 shows a three-dimensional view of an IGBT according to a further embodiment of the invention. Many of the features of this embodiment are the same as those shown in FIG. 1 and FIG. 3, and therefore carry the same reference numerals. In this embodiment the emitter trench 415 has variable width in the z-direction. The trench segments 415 are connected by trench of width $W_{et2}$ so that the emitter trench 415 has a 'cross' shape when viewed in the x-z plane. This feature reduces the area of p+ contact 440. In the on-state, reduced p+ contact area reduces the hole collection area, which improves 'hole pile up' effect and enhances the conductivity modulation in the emitter region. This reduces on-state conduction loss ($V_{CE(ON)}$) in the device.

Figure 5:
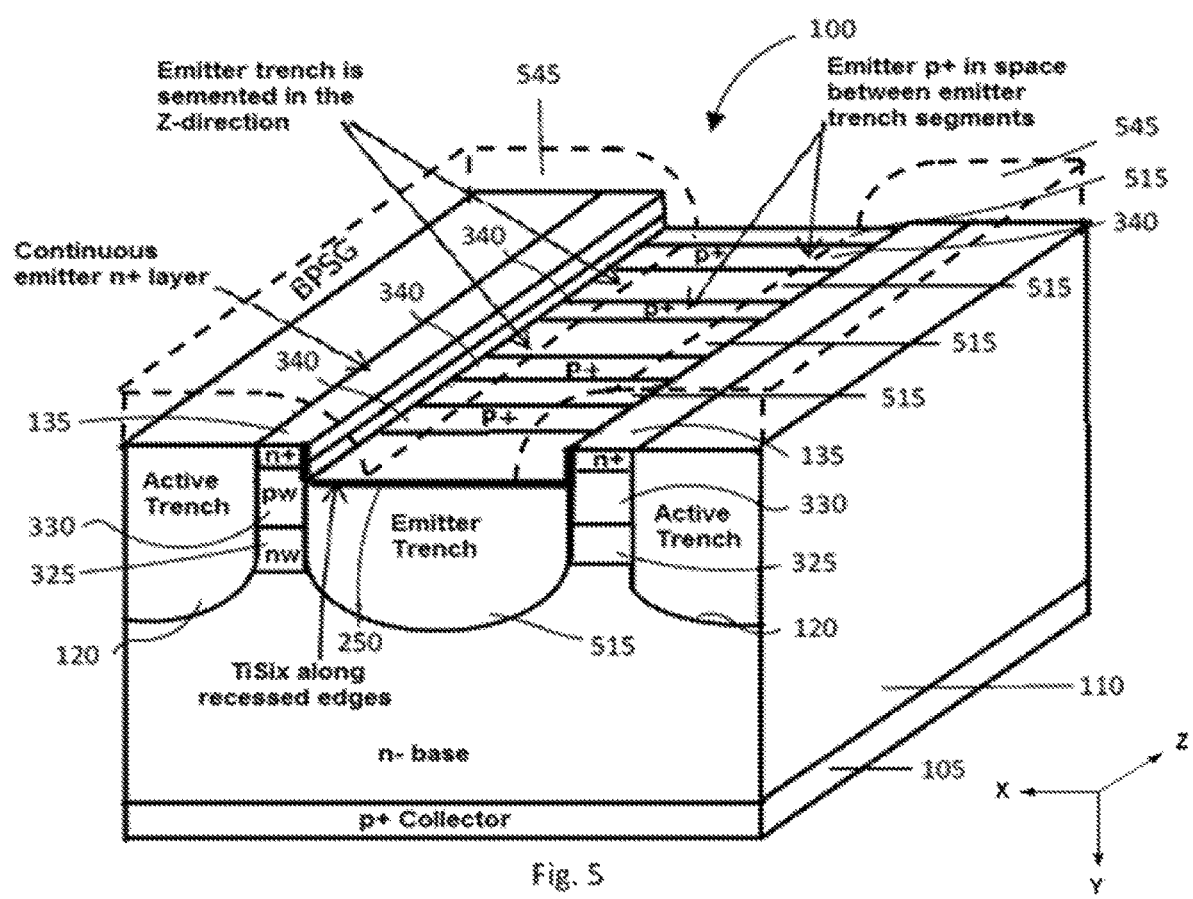
FIG. 5 illustrates a 3D view of an alternative semiconductor device in which the recess edge, the emitter trench edge, and the contact edge coincide.

FIG. 5 shows a three-dimensional view of an IGBT according to a further embodiment of the invention. Many of the features of this embodiment are the same as FIG. 3 and FIG. 1, and therefore carry the same reference numerals. However, in the IGBT device shown in FIG. 5 the BPSG layer 545 is etched so that the edges of the contact area are in the same position in the x-direction as the edges of the recessed emitter trench 515. This feature may be beneficial when the dimension in the x-direction of the emitter trench is smaller than about 0.5 μm. This feature does not alter the hole and electron current flow paths. This embodiment may or may not have a silicide layer 250.

Figure 6:
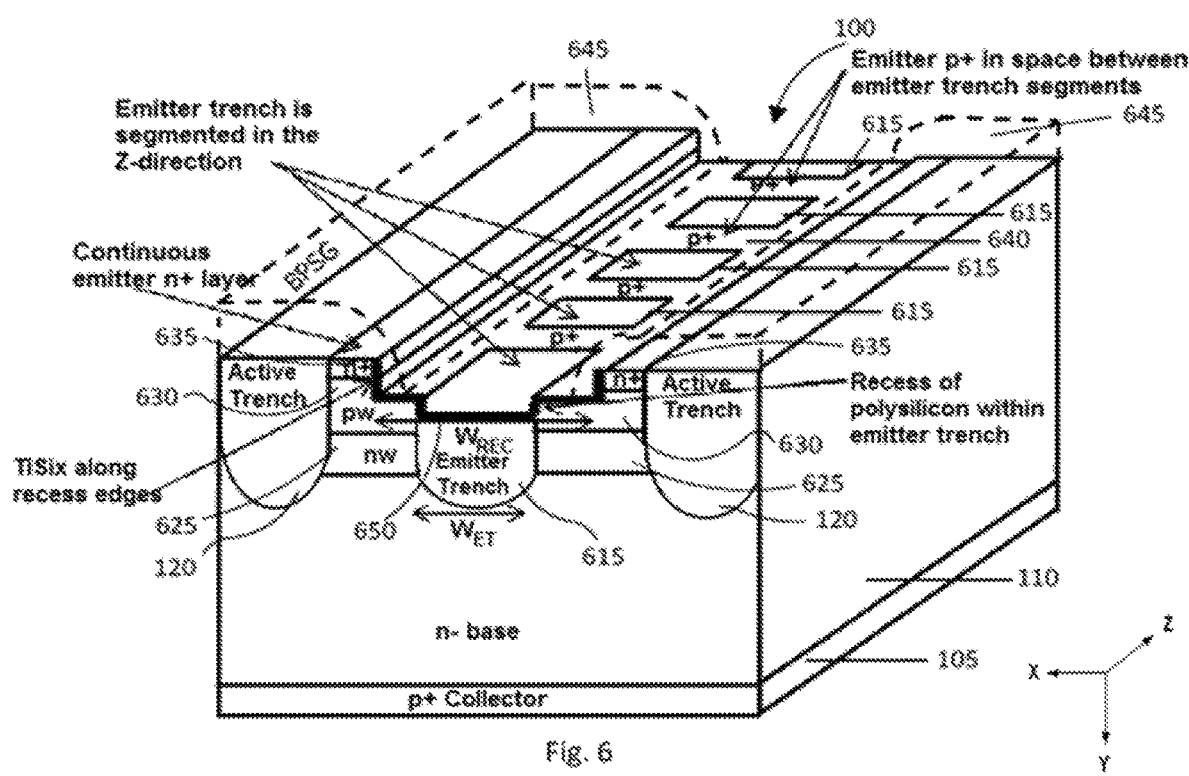
FIG. 6 illustrates a 3D view of an alternative semiconductor device with a further recess in the polysilicon within the emitter trench.

FIG. 6 shows a three-dimensional view of an IGBT according to a further embodiment of the invention. Many of the features of this embodiment are the same as FIG. 1 and therefore carry the same reference numerals. In this embodiment the polysilicon within the emitter trench 615 is further recessed in the y-direction from the top of the emitter trench 615. The recessed width ($W_{REC}$) may be greater than the emitter trench width ($W_{ET}$). The emitter trench 615 is segmented in the y-direction as shown in previous embodiments. P+ contacts 640 are formed in the spaces between the emitter trench segments 615. The n-well layer 625 and p-well layer 630 extend under the recessed portion around the emitter trench 615. This feature may be beneficial when the dimension of the emitter trench in the x-direction is smaller than about 0.5 um. This feature improves hole collection area which can lower turn off energy loss ($E_{OFF}$).

Figure 7:
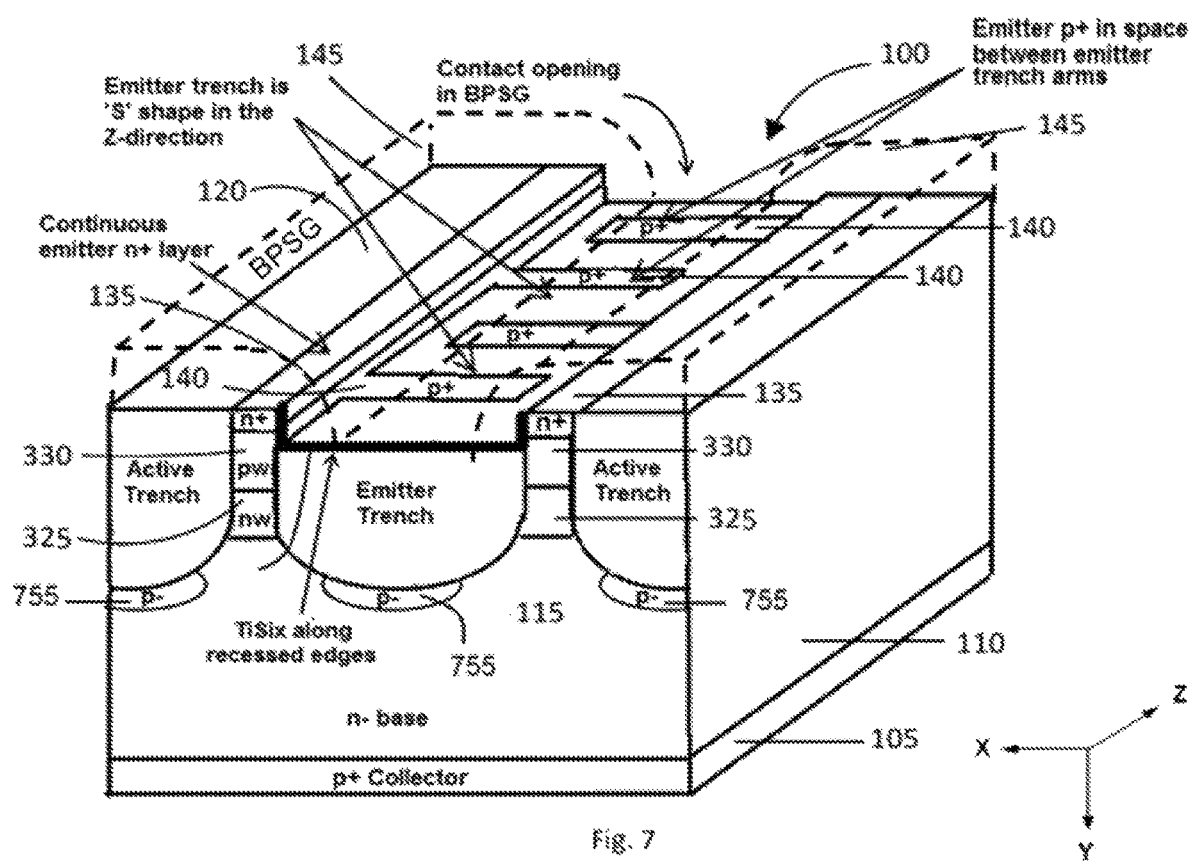
FIG. 7 illustrates a 3D view of an alternative semiconductor device with p-type implants under the trenches.

FIG. 7 shows a three-dimensional view of an IGBT according to a further embodiment of the invention. Many of the features of this embodiment are the same as FIG. 1 and therefore carry the same reference numerals. However in this embodiment, the active trenches 120 and emitter trench 115 have a p-type implant 755 underneath. The trench bottom in high voltage devices is prone to high electric field stress due to its geometrical effects. With thin gate oxide, this can cause premature device breakdown. P-type implants 755 under the trenches can relieve the electric field under the trenches.

Figure 8:
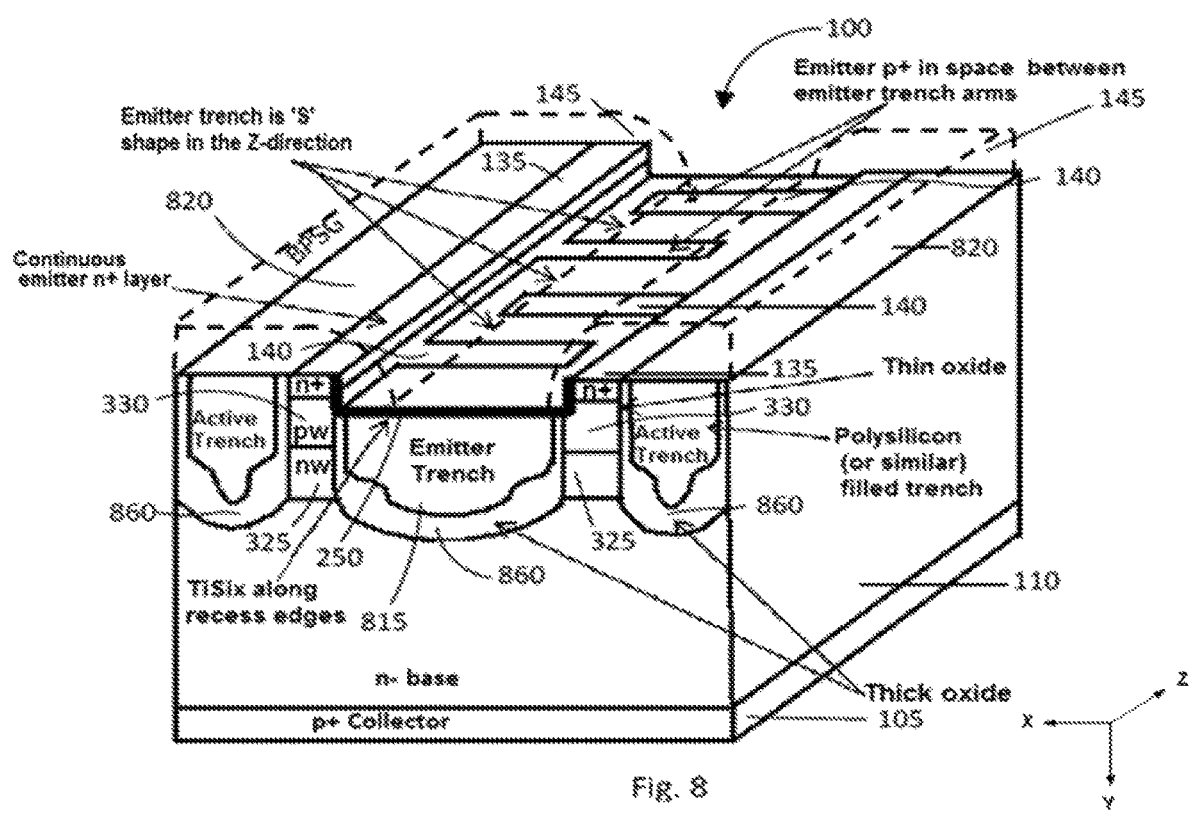
FIG. 8 illustrates a 3D view of an alternative semiconductor device with a thick oxide layer along the bottom and low sides of the trenches.

FIG. 8 shows a three-dimensional view of an IGBT according to a further embodiment of the invention. Many of the features of this embodiment are the same as FIG. 1 and therefore carry the same reference numerals. In this embodiment the active trenches 820 and emitter trench 815 have a thick oxide layer 860 along the bottom and low sides of the polysilicon filled trenches 815, 820. Thin oxide in the trench bottom can suffer from premature breakdown under high electric fields especially if the n-well is significantly enhanced. The feature of trenches with a thick bottom oxide 860 improves immunity to high electric field stress and harness the device breakdown voltage. Oxide breakdown electric field increases with oxide thickness.

Figure 9:
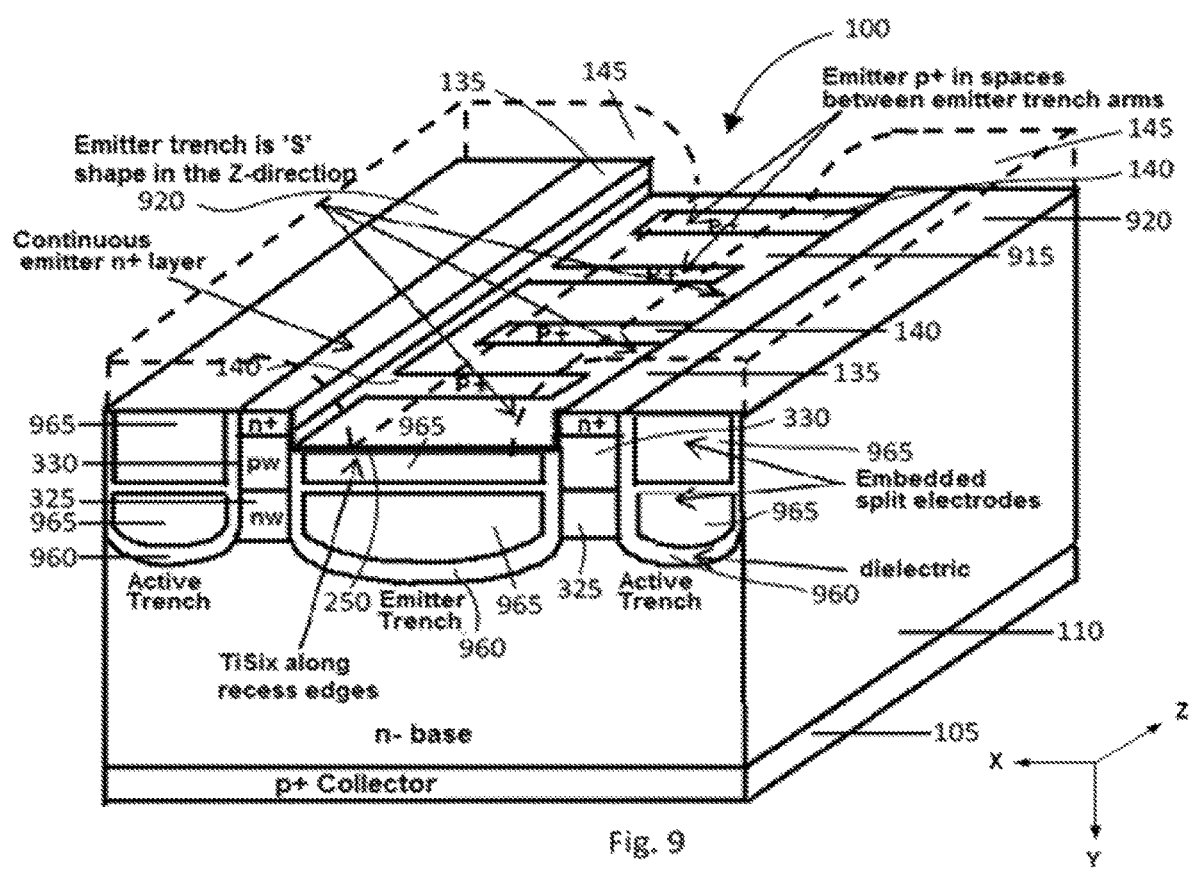
FIG. 9 illustrates a 3D view of an alternative semiconductor device with embedded split electrodes within the trenches.

FIG. 9 shows a three-dimensional view of an IGBT according to a ninth embodiment of the invention. Many of the features of this embodiment are the same as FIG. 1 and therefore carry the same reference numerals. Within the active trenches 920 and emitter trench 915 there are provided split embedded electrodes 965. A potential difference can be applied to the split embedded electrodes 965, enhancing electron injection from the MOS channel in the on-state. Enhanced electron injection will improve conductivity modulation in the emitter region and reduce conduction loss ($V_{CE(ON)}$).

Figure 10:
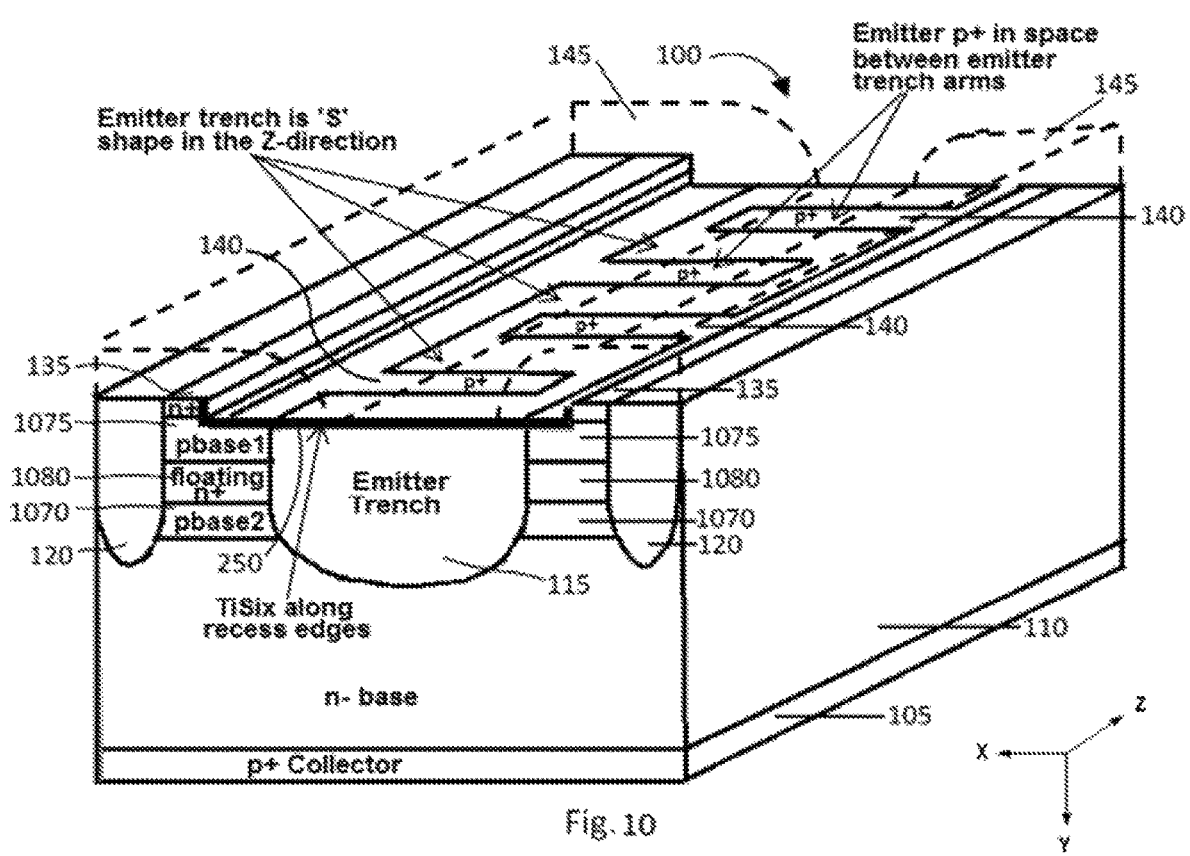
FIG. 10 illustrates a 3D view of a gate controlled thyristor structure having a recessed emitter trench structure according to one embodiment.

FIG. 10 shows a three-dimensional view of a MOS gate controlled thyristor structure, such as an emitter switched thyristor (EST) or similar, with a recessed emitter trench 115 variable in the z-direction. ESTs provide lower $V_{CE(ON)}$ than IGBTs because of the thyristor mode of operation in the on-state, compared to PNP transistor action in IGBTs. Many of the features of this embodiment are the same as FIG. 1 and therefore carry the same reference numerals. However, the EST comprises two p-base regions 1070, 1075 underneath the n+ source region 135. A floating n+ region 1080 is formed in between the two p-base regions 1070, 1075. In an EST the second p-base region 1075 is connected to the first p-base region 1070 and grounded through the p+ regions 140. The recessed grounded emitter trench 115 and variation of the emitter trench 115 and p+ contact 140 in the third dimension improve the electron and hole flow during on-state and turn-off similar to in an IGBT. The recessed emitter trench variable in the third dimension enables ESTs to benefit from reduced $V_{CE(ON)}$ and enhanced $V_{CE(ON)}$-$E_{OFF}$ trade-offs.

Figure 11:
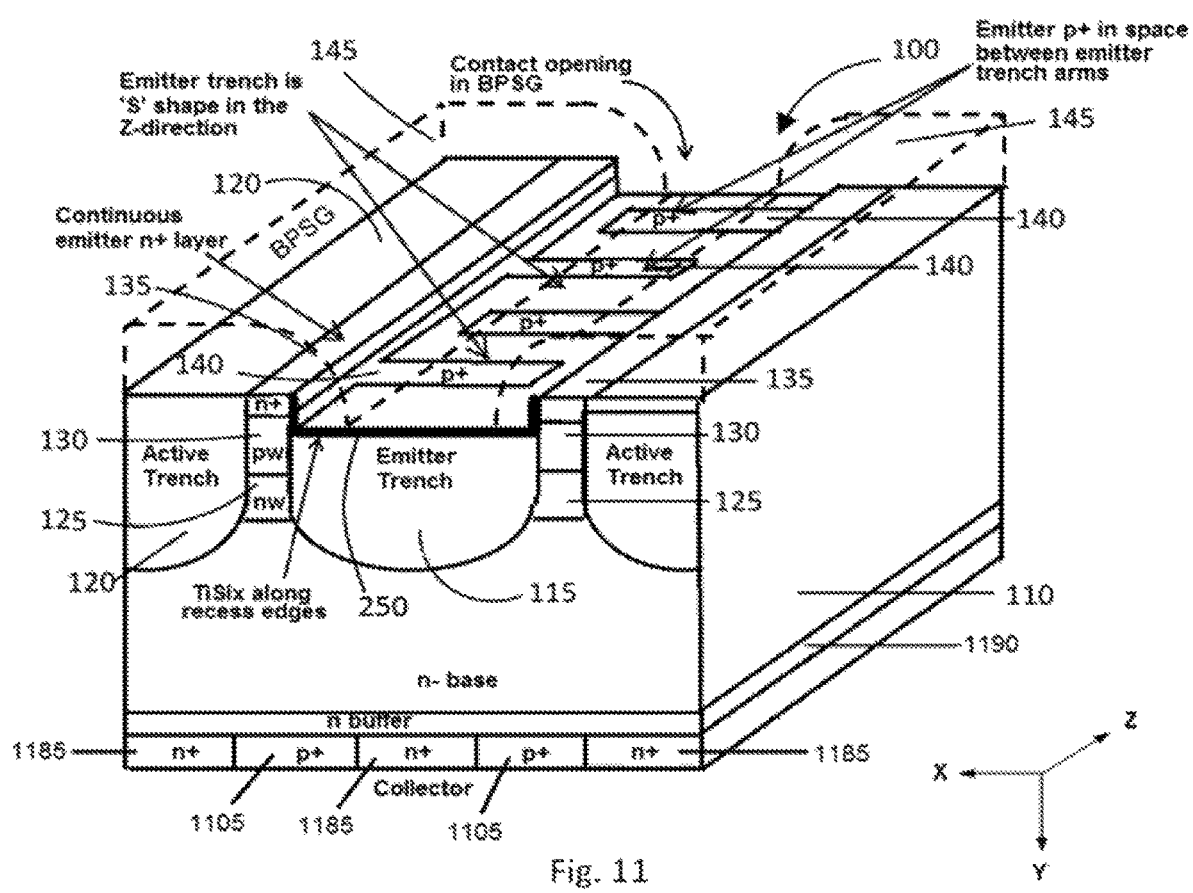
FIG. 11 illustrates a 3D view of a reverse conducting IGBT having a recessed emitter trench structure according to one embodiment.
Figure 12A:
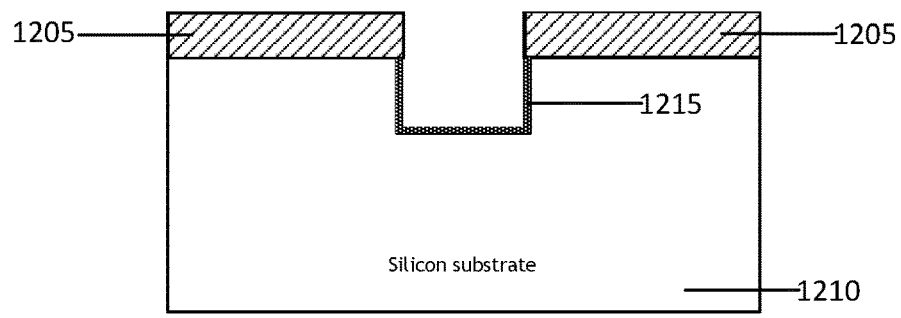
FIGS. 12(a) to 12(e) show a manufacturing process of the device of FIG. 8.
Figure 12B:
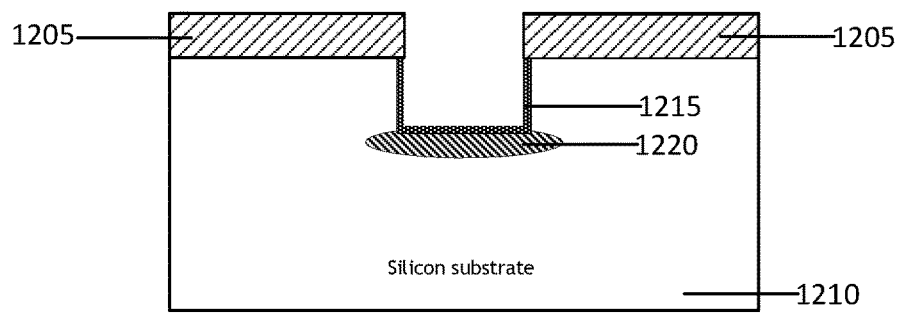
Figure 12C:
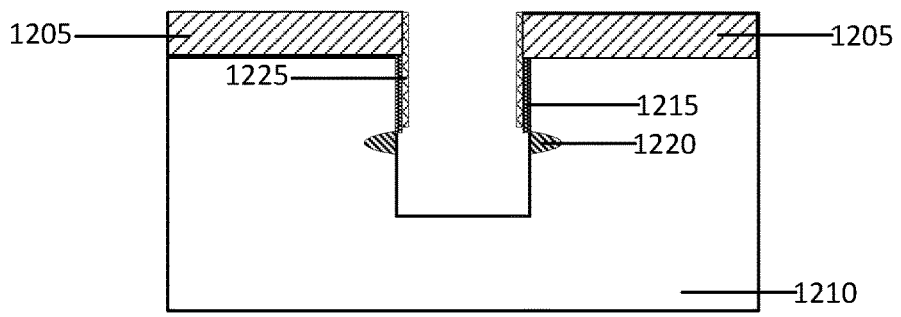
Figure 12D:
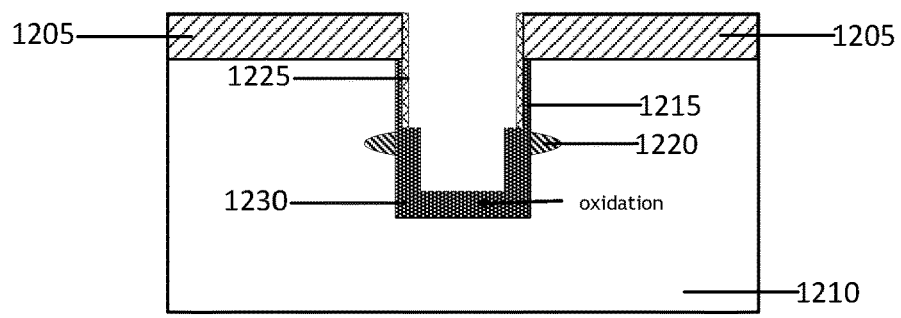
Figure 12E:
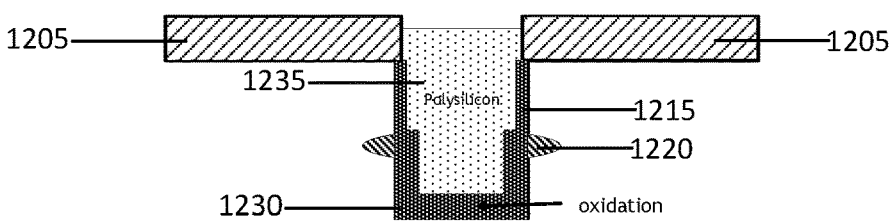

FIG. 11 shows a three-dimensional view of a reverse conducting IGBT (RC-IGBT) with a recessed emitter trench 115 variable in the z-direction. Many of the features of this embodiment are the same as FIG. 1 and therefore carry the same reference numerals. However, in this embodiment the collector comprises one or more p+ segments 1105 and one or more n+ segments 1185. There may be an n-buffer 1190 layer formed over the p+ and n+ segments 1105, 1185. The n+ regions 1185 in the collector provide reverse conducting capability to the IGBT when in diode mode. The n+/p+ ratio in RC-IGBT has to be carefully optimised to avoid snap-back phenomenon. Furthermore large emitter p+ contact area is not beneficial as it makes diode reverse recovery poor. An RC-IGBT can benefit from the feature of a recessed emitter trench 115 variable in the z-direction as the emitter p+ area can be much less than in a conventional IGBT. The reduced trench-to trench spacing in the x-direction can reduce the n+/p+ optimisation requirement.

FIGS. 12(a) to 12(e) show a manufacturing process of the embodiment of FIG. 8.

FIGS. 12(a) to 12(e) show the steps as follows:
1. Provide an etch mask 1205, preferably comprising silicon oxide, on top of a substrate 1210, preferably comprising silicon;
2. Etch the substrate 1210 (plasma etch) to a depth equal to the intended transistor channel length (for example about 3 um);
3. Oxidise the sidewall of the trench to for example about 500 A which will form a protective layer 1215 on the sidewall;
4. Implant an n-type dopant 1220 (for example phosphorous) in a vertical direction so that no implant goes into the sides at an energy that goes through the oxide (for example 100 kev) and a dose that will determine the level of dopant left in the silicon 1210;
5. Diffuse the dopant 1220 to produce vertical and sideways diffusion;
6. Deposit a thin layer of silicon nitride 1225 (for example 2000A in an LPCVD furnace) which conformally coats all surfaces;
7. Plasma etch the silicon nitride 1225 in a vertical direction only to leave nitride on the trench sidewalls;
8. Plasma etch again in a vertical direction the oxide 1215 remaining in the bottom of the trench followed by further silicon etch of say 3 um;
9. Furnace oxidation oxidises the exposed silicon surface of for example 3000 A forming a thick oxide layer 1230 on the bottom and low sides of the trench. The nitride 1225 prevents the oxidation and the remaining etch mask 1205 of thicker oxide significantly reduces the oxidation;
10. The nitride layer 1225 is removed by for example a wet etch using heated orthophosphoric acid; and
11. Further oxidation (of say a further 500 A) is performed if necessary to achieve the required transistor parameters.

The advantage of the achieved structure is that the active part of the transistor determined by the thinner oxide region 1215 is not significantly different to a normal device, but the thicker oxide 1230 along the bottom and low sides of the transistor help withstand the increased electric field in these areas and additionally greatly reduces the capacitance between the gate electrode and the silicon substrate.

It will be appreciated that, in the above mentioned FIGS. 1 to 12, the emitter trench is (generally) fully recessed in some embodiments. This results in a smaller width and a shallower depth for the emitter trench compared to the active trenches.

The skilled person will understand that in the preceding description and appended claims, positional terms such as 'above', 'overlap', 'under', 'lateral', 'vertical', etc. are made with reference to conceptual illustrations of a semiconductor device, such as those showing standard cross-sectional perspectives and those shown in the appended drawings. These terms are used for ease of reference but are not intended to be of limiting nature. These terms are therefore to be understood as referring to a transistor when in an orientation as shown in the accompanying drawings.

It will be appreciated that all doping polarities mentioned above could be reversed, the resulting devices still being in accordance with the present invention. It will be appreciated that the emitter, collector and trench gate (active trench) could be arranged to be out-of-plane or to be differently aligned so that the direction of the carriers is not exactly as described above, the resulting devices still being in accordance with the present invention.

Although the invention has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the invention, whether alone or in any appropriate combination with any other feature disclosed or illustrated herein.

The invention claimed is:

1. A gate controlled bipolar semiconductor device comprising:
   a collector region of a first conductivity type;
   a drift region of a second conductivity type located over the collector region;
   a body region of a first conductivity type located over the drift region;
   a plurality of first contact regions of a second conductivity type located above the body region and having a higher doping concentration than the body region;
   a second contact region of a first conductivity type located laterally adjacent to the plurality of first contact regions, the second contact region having a higher doping concentration than the body region;
   at least two active trenches each extending from a surface into the drift region;
   an emitter trench extending from the surface into the drift region;
   wherein each first contact region adjoins an active trench of the at least two trenches so that, in use, a channel is formed along said each active trench and within the body region;
   wherein the second contact region adjoins the emitter trench; and
   wherein the emitter trench is located between two active trenches of the at least two trenches, and
   wherein the at least two active trenches and the emitter trench are laterally spaced in a first dimension, and wherein current flows in the device in a second dimension substantially traverse to the first dimension, and
   wherein the at least two active trenches and the emitter trench extend in a third dimension of the device, and wherein the second contact region is formed completely within the emitter trench and extends from an outer surface of a vertical sidewall of the emitter trench in the first dimension and extends into the emitter trench in the third dimension of the device.

2. The device according to claim 1, wherein the second contact region is located between two laterally spaced first contact regions;
   and/or wherein the gate controlled bipolar semiconductor device is configured such that the emitter trench is biased at a ground potential.

3. The device according to claim 1, wherein a width of the second contact region is less than or equal to a width of the emitter trench.

4. The device according to claim 1, wherein the second contact region does not extend into the body region between the active trench and the emitter trench.

5. The device according to claim 1, wherein the emitter trench comprises a plurality of segments in the third dimension, wherein the plurality of segments are shaped such that at least a space is formed between two segments of the plurality of segments; and
   wherein the second contact region comprises a plurality of portions in the third dimension, each portion being located within the space formed between two segments of the plurality of segments of the emitter trench.

6. The device according to claim 5,
   wherein the plurality of segments of the emitter trench are discontinuous segments, and wherein the portions of the second contact region each have a substantially equal width compared to the segments of the plurality of segments of the emitter trench.

7. The device according to claim 5, wherein the plurality of segments of the emitter trench have a cross shape having a variable width along the third dimension; and
   optionally wherein two portions of the second contact region are laterally spaced and a segment of the plurality of segments of the emitter trench is formed between said two portions of the second contact region, and wherein the segment between two portions has a predetermined width.

8. The device according to claim 1, wherein the first contact region is a continuous region in the third dimension; or wherein the first contact region comprises segments spaced from one another in the third dimension.

9. The device according to claim 1, further comprising a region adjacent the emitter trench, wherein the region comprises a first recessed portion extending from the surface of the device to the emitter trench; and
   optionally further comprising a second recessed portion extending from the first recessed portion into the emitter trench.

10. The device according to claim 1, wherein the at least two active trenches and the emitter trench have the same width in the first dimension; or
    wherein the at least two active trenches and the emitter trench have different widths in the first dimension.

11. The device according to claim 1, wherein the emitter trench is fully recessed; and optionally
    wherein the emitter trench has a smaller width and a shallower depth compared to the at least two active trenches.

12. The device according to claim 1, further comprising implants of a first conductivity type on a bottom of one or more of the at least two active trenches and the emitter trench; and/or
    further comprising an oxide layer at a bottom side wall which is thicker than an oxide layer at vertical sidewalls of one or more of the active and emitter trenches; and/or
    wherein one or more of the active and emitter trenches comprise split embedded electrodes; and/or
    further comprising a charge storage layer of a second conductivity type between the drift region and body region.

13. The device according to claim 1, wherein the device is an insulated gate bipolar transistor (IGBT).

14. The device according to any claim 1, wherein the collector comprises a plurality of first segments of a first conductivity type and a plurality of second segments of a second conductivity type, wherein the plurality of first segments and the plurality of second segments are laterally adjacent to one another.

15. The device according to claim 14, wherein the device is a reverse conducting insulated gate bipolar transistor (RC-IGBT).

16. The device according to claim 1, further comprising:
    a floating semiconductor body of a second conductivity type underneath the body region;

a base region of a first conductivity type underneath the floating semiconductor body;
wherein the base region is connected to the body region in the third dimension; and
wherein the base region is biased at a ground potential through the second contact region; and optionally
wherein the device is an emitter switched thyristor.

17. The device according to claim 5,
wherein the plurality of segments of the emitter trench are continuous segments having a substantially 'S' shape, and wherein the portions of the second contact region each have a smaller width compared to the segments the plurality of segments of the emitter trench.

18. The device according to claim 1, further comprising a region adjacent the emitter trench, wherein the region comprises:
a first recessed portion extending from the surface of the device to the emitter trench;
a second recessed portion extending from the first recessed portion into the emitter trench; and
a silicide layer along an at least one edge of the first recessed portion and/or the second recessed portion.

19. A gate controlled bipolar semiconductor device comprising:
a collector region of a first conductivity type;
a drift region of a second conductivity type located over the collector region;
a body region of a first conductivity type located over the drift region;
a plurality of first contact regions of a second conductivity type located above the body region and having a higher doping concentration than the body region;
a second contact region of a first conductivity type located laterally adjacent to the plurality of first contact regions, the second contact region having a higher doping concentration than the body region;
at least two active trenches each extending from a surface into the drift region;
an emitter trench extending from the surface into the drift region;
wherein each first contact region adjoins an active trench of the at least two active trenches so that, in use, a channel is formed along said each active trench and within the body region;
wherein the second contact region adjoins the emitter trench; and
wherein the emitter trench is located between two active trenches of the at least two active trenches, and
wherein the at least two active trenches and the emitter trench are laterally spaced in a first dimension, and wherein current flows in the device in a second dimension substantially traverse to the first dimension, and
wherein the at least two active trenches and the emitter trench extend in a third dimension of the device, and wherein the second contact region is formed within a part of the emitter trench that is directly extending into the drift region, and wherein the second contact region extends from an outer surface of a vertical sidewall of the emitter trench in the first dimension and extends into the emitter trench in the third dimension of the device.

* * * * *